US009484233B2

(12) United States Patent
Leeser

(10) Patent No.: US 9,484,233 B2
(45) Date of Patent: Nov. 1, 2016

(54) CAROUSEL REACTOR FOR MULTI-STATION, SEQUENTIAL PROCESSING SYSTEMS

(71) Applicant: Novellus Systems, Inc., San Jose, CA (US)

(72) Inventor: Karl Leeser, Lake Oswego, OR (US)

(73) Assignee: NOVELLUS SYSTEMS, INC., San Jose, CA (US)

( * ) Notice: Subject to any disclaimer, the term of this patent is extended or adjusted under 35 U.S.C. 154(b) by 606 days.

(21) Appl. No.: 13/862,408

(22) Filed: Apr. 13, 2013

(65) Prior Publication Data

US 2013/0269609 A1  Oct. 17, 2013

Related U.S. Application Data

(60) Provisional application No. 61/623,928, filed on Apr. 13, 2012.

(51) Int. Cl.
| | |
|---|---|
| *H01L 21/677* | (2006.01) |
| *H01L 21/67* | (2006.01) |
| *H01L 21/687* | (2006.01) |

(52) U.S. Cl.
CPC ..... *H01L 21/67703* (2013.01); *H01L 21/6719* (2013.01); *H01L 21/67109* (2013.01); *H01L 21/68742* (2013.01); *H01L 21/68764* (2013.01); *H01L 21/68771* (2013.01)

(58) Field of Classification Search
CPC ................... C23C 16/45551; C23C 16/4584; H01L 21/68764
See application file for complete search history.

(56) References Cited

U.S. PATENT DOCUMENTS

| | | | |
|---|---|---|---|
| 6,095,085 A | * | 8/2000 | Agarwal ............... C23C 16/452 118/723 ER |
| 6,120,640 A | | 9/2000 | Shih et al. |
| 6,494,958 B1 | | 12/2002 | Shamouilian et al. |
| 6,634,314 B2 | | 10/2003 | Hwang et al. |
| 6,902,620 B1 | * | 6/2005 | Omstead ........... C23C 16/45551 117/102 |

(Continued)

FOREIGN PATENT DOCUMENTS

| | | |
|---|---|---|
| CN | 101620989 A | 1/2010 |
| JP | 11214195 A | 8/1999 |

(Continued)

OTHER PUBLICATIONS

Notification Concerning Transmittal of International Preliminary Report on Patentability for PCT/US2012/052789 filed Aug. 29, 2012; 9 pages.

(Continued)

*Primary Examiner* — Parviz Hassanzadeh
*Assistant Examiner* — Nathan K Ford

(57) ABSTRACT

A reactor for processing a plurality of substrates includes P processing station assemblies arranged symmetrically around an axis, where P is an integer greater than one. A pedestal carousel assembly includes P pedestal assemblies arranged symmetrically around the axis, each of the P pedestal assemblies including a pedestal. A rotational actuator rotates the pedestal carousel assembly relative to the axis to selectively index the P pedestal assemblies with the P processing station assemblies. Each of the P processing station assemblies processes substrates arranged on corresponding ones of the P pedestal assemblies at the same time.

41 Claims, 12 Drawing Sheets

(56) References Cited

U.S. PATENT DOCUMENTS

| | | |
|---|---|---|
| 7,153,542 B2 | 12/2006 | Nguyen et al. |
| 8,043,842 B2 | 10/2011 | Blattner et al. |
| 2001/0047760 A1 | 12/2001 | Moslehi |
| 2004/0000378 A1* | 1/2004 | Lee .................... H01L 21/6719 156/345.51 |
| 2004/0065255 A1 | 4/2004 | Yang et al. |
| 2006/0057303 A1* | 3/2006 | Agarwal ............... H01J 37/304 427/523 |
| 2007/0031236 A1* | 2/2007 | Chen ................. H01L 21/67742 414/783 |
| 2008/0075858 A1 | 3/2008 | Koh |
| 2008/0241517 A1 | 10/2008 | Kenworthy et al. |
| 2010/0000684 A1 | 1/2010 | Choi |
| 2012/0225193 A1 | 9/2012 | Yudovsky |
| 2012/0225195 A1 | 9/2012 | Yudovsky |
| 2013/0092086 A1 | 4/2013 | Keil et al. |

FOREIGN PATENT DOCUMENTS

| | | |
|---|---|---|
| KR | 10-0388530 B1 | 6/2003 |
| KR | 100565131 B1 | 3/2006 |
| KR | 20080001336 A | 1/2008 |
| KR | 10-0845896 B1 | 7/2008 |
| KR | 20100004857 A | 1/2010 |
| WO | WO-9943018 A1 | 8/1999 |

OTHER PUBLICATIONS

International Search Report and Written Opinion for PCT/US2012/052789 filed Aug. 28, 2012; 13 pages.

First Office Action dated Nov. 17, 2015 corresponding to Chinese Patent Application No. 201280062473.3, 8 pages.

* cited by examiner

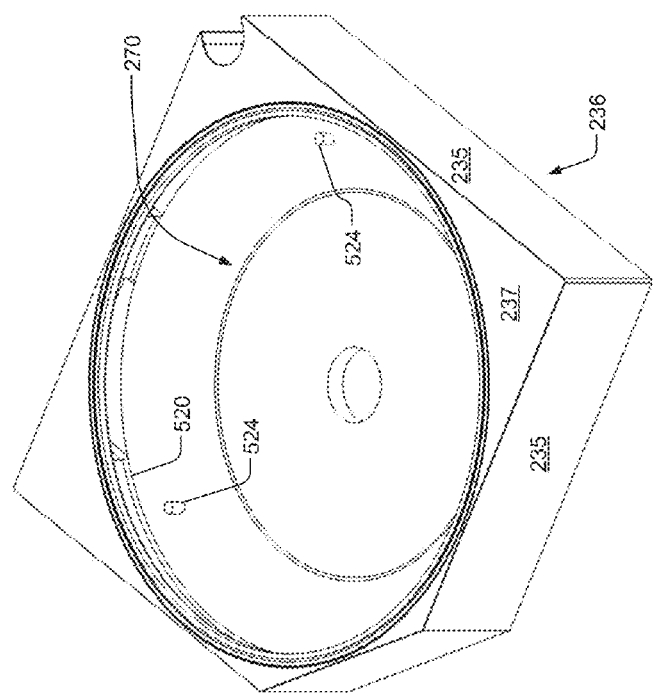
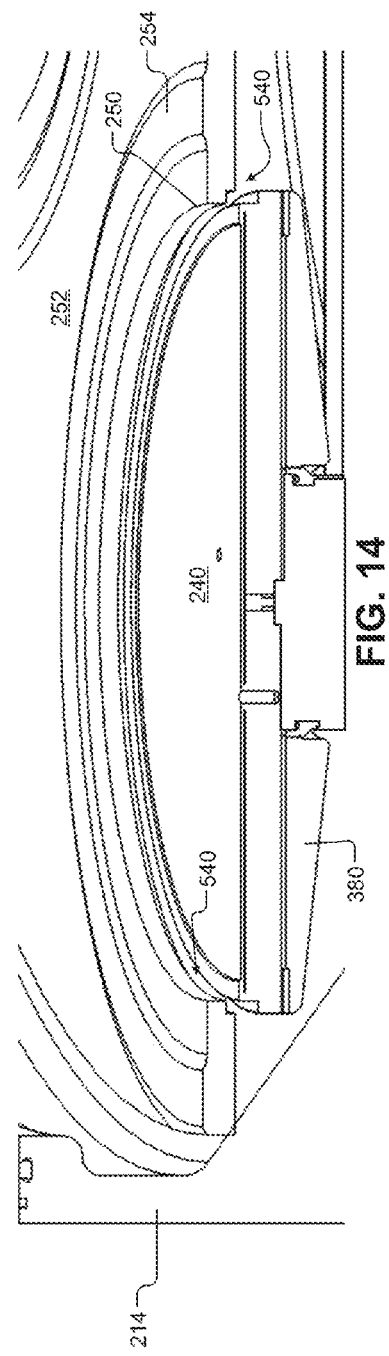

CAROUSEL REACTOR FOR MULTI-STATION, SEQUENTIAL PROCESSING SYSTEMS

CROSS-REFERENCE TO RELATED APPLICATIONS

This application claims the benefit of U.S. Provisional Application No. 61/623,928, filed on Apr. 13, 2012. The entire disclosure of the above application is incorporated herein by reference.

FIELD

The present disclosure relates to substrate reactors and more specifically to carousel reactors in multi-station, sequential processing systems.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems such as semiconductor processing systems may be used to deposit film layers, metal layers or other types of layers onto a substrate such as a semiconductor wafer. The substrate processing system may include one or more processing station assemblies. In a substrate processing system, substrate handling can have a significant impact on cost and throughput. To increase throughput and reduce cost, the substrates need to be processed through different processing steps in the most efficient manner and with minimal or no contamination.

In some substrate processing systems, the substrates are moved from a substrate cassette to a reactor and then back to a substrate cassette or another location. To improve throughput and reduce substrate handling, a single reactor may include multiple, sequential processing station assemblies. In this type of substrate processing system, the substrate is moved to the reactor, processed sequentially in the processing station assemblies and then moved to a substrate cassette or another location. This processing arrangement tends to increase throughput by reducing substrate handling.

Referring now to FIG. 1, an example of a substrate processing system 8 includes a multi-station, sequential processing (MSSP) reactor 10 with multiple stations 14-1, 14-2, 14-3 and 14-4 (collectively stations 14) and pedestals 16-1, 16-2, 16-3 and 16-4 (collectively pedestals 16). While four stations are shown, additional or fewer stations can be used. A vacuum transfer chamber 18 is in communication with the reactor 10 via valves (not shown) and includes a substrate handling robot 22. A load lock 24 is in communication with the vacuum transfer chamber 18 via valves (not shown).

A substrate handler 26 includes a substrate handling robot 28 and substrate cassettes 30. The substrate handling robot 28 loads a substrate from one of the substrate cassettes 30 into the load lock 24 for cleaning. When the load lock 24 is ready, the substrate handling robot 22 transfers the substrate to one of the stations 14 of the reactor 10.

Referring now to FIG. 2, an example of an indexing mechanism 54, which is a two-axis wafer transfer mechanism, is shown. The mechanism includes a transfer plate 55, a spindle assembly 56 and a multiple carrier rings 16-1, 16-2, 16-3, and 16-4. As can be appreciated, the indexing mechanism 54 takes up a significant amount of chamber volume of the reactor. The indexing mechanism 54 is always present in the reactor because it cannot retract or otherwise be removed from the chamber volume. The indexing mechanism 54 also requires anomalous features in the design of a pedestal 58 to enable transfer onto the indexing mechanism 54. Moreover, substrate displacement tends to occur during substrate transfer via the indexing mechanism 54. The substrate displacement can cause cumulative and increasing eccentricity in substrate placement on subsequent pedestals.

SUMMARY

A reactor for processing a plurality of substrates includes P processing station assemblies arranged symmetrically around an axis, where P is an integer greater than one. A pedestal carousel assembly includes P pedestal assemblies arranged symmetrically around the axis, each of the P pedestal assemblies including a pedestal. A rotational actuator rotates the pedestal carousel assembly relative to the axis to selectively index the P pedestal assemblies with the P processing station assemblies. Each of the P processing station assemblies processes substrates arranged on corresponding ones of the P pedestal assemblies at the same time.

In other features, a platen includes P openings. The P pedestal assemblies are located in the P openings of the platen. Indexing of the P pedestal assemblies between the P processing station assemblies during processing is performed by rotating the P pedestal assemblies in a single plane and without a change in an axial location of the P pedestal assemblies.

In other features, an aperture through a wall of the reactor allows loading and unloading of the substrates. An axial actuator adjusts an axial position of the pedestal carousel assembly. A controller is configured to communicate with the axial actuator and the rotational actuator, to lower the pedestal carousel assembly in an axial direction and to align one of the P pedestal assemblies with the aperture during loading and to raise the pedestal carousel assembly in an opposite axial direction for processing.

In other features, the platen includes P annular raised portions located around the P openings. The P annular raised portions circumscribe the P processing station assemblies when aligned to provide a fluid restriction between volume inside and outside of the P processing station assemblies and the P pedestal assemblies.

In other features, a pump selectively pumps fluid outside of the restriction created by the P annular raised portions during processing. Purge gas may be provided outside of the restriction created by the P annular raised portions during processing. A controller controls the pump, supplies process gases to the P processing station assemblies during processing and evacuates process gases in the P processing station assemblies before the pedestal carousel assembly indexes the P pedestal assemblies to a next index position.

In other features, at least one of the P pedestal assemblies further comprises lift pins that move with the P pedestal assemblies and that raise and lower a substrate relative to a pedestal of one of the P pedestal assemblies.

In other features, a controller communicates with a lift pin actuator and a substrate handler and is configured to lower the pedestal carousel assembly, position the lift pins of at least one pedestal in a raised position, and position a substrate on the at least one pedestal.

In other features, the controller is further configured to raise the pedestal carousel assembly, position the lift pins of the at least one pedestal in a lowered position, process the substrate in one of the P processing station assemblies, and index the substrate to other ones of the P processing station assemblies and process the substrate in the other ones of the P processing station assemblies.

In other features, when unloading, the controller lowers the pedestal carousel assembly at the same time as the controller raises the lift pins of the at least one pedestal. When loading, the controller raises the pedestal carousel assembly at the same time as the controller lowers the lift pins of the at least one pedestal.

In other features, at least one of the P processing station assemblies includes a showerhead. The showerhead is made of a dielectric material and includes an embedded electrode. The reactor performs atomic layer deposition (ALD) in at least one of the plurality of processing station assemblies. The reactor performs plasma-enhanced atomic layer deposition (PEALD) in at least one of the plurality of processing station assemblies.

In other features, a controller is configured to position the pedestal carousel assembly in a cleaning position. The pedestal carousel assembly aligns the P pedestal assemblies with the P processing station assemblies to clean areas inside the P pedestal assemblies and the P processing station assemblies.

In other features, a controller is configured to position the pedestal carousel assembly in a cleaning position. The pedestal carousel assembly is not aligned with the P processing station assemblies to clean areas between the P processing station assemblies and the P pedestal assemblies and portions of the platen located between the P pedestal assemblies.

In other features, a controller is configured to position the pedestal carousel assembly in a cleaning position. The pedestal carousel assembly is lowered and the platen is raised relative to the P pedestal assemblies to define a gap between the platen and the P pedestal assemblies to allow cleaning of the P processing station assemblies, the P pedestal assemblies, and surfaces in a cavity below the platen.

In other features, the lower housing portion includes at least one of a ledge and a post to lift the platen as the pedestal carousel assembly is lowered to define the gap.

In other features, an upper housing portion includes P openings. The P processing station assemblies are located in the P openings. A lower housing portion is arranged adjacent to the upper housing portion.

In other features, the pedestal carousel assembly rotates relative to the lower housing portion and the lower housing portion is fixed relative to the upper housing portion. The pedestal carousel assembly rotates with the lower housing portion and the lower housing portion rotates relative to the upper housing portion. The pedestal carousel assembly is located inside of the lower housing portion and includes P arms extending radially outwardly from a hub. The P pedestal assemblies are connected to the P arms, and a platen including P openings for receiving the P pedestal assemblies.

In other features, an exhaust opening is formed in the upper housing portion and aligned with the axis. An exhaust conduit is connected to the exhaust opening. P radial exhaust conduits extend radially outwardly from the exhaust conduit and are fluidly connected to the P processing station assemblies.

In other features, a bearing surface is located between the upper housing portion and the lower housing portion to provide sealing between the upper housing portion and the lower housing portion and to allow rotation of the lower housing portion relative to the upper housing portion. The bearing surface includes a gas bearing. The gas bearing is differentially pumped. A ferrofluidic seal assembly is arranged between the upper housing portion and the lower housing portion.

In other features, the reactor includes first and second apertures to the reactor. A controller is configured to lower the pedestal carousel assembly to allow unloading of first and second substrates from first and second pedestals of first and second ones of the P pedestal assemblies and loading of third and fourth substrates onto the first and second pedestals of the first and second ones of the P pedestal assemblies.

In other features, the controller is configured to rotate the pedestal carousel assembly to allow unloading of fifth and sixth substrates from third and fourth pedestals of third and fourth ones of the P pedestal assemblies and loading of seventh and eighth substrates onto the third and fourth pedestals of the third and fourth ones of the P pedestal assemblies. The controller is configured to raise the pedestal carousel assembly and index the P pedestal assemblies with the P processing station assemblies.

In other features, the pedestal carousel assembly is rotated during cleaning. The pedestal carousel assembly is moved midway between index positions during cleaning.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 13 is a perspective view illustrating an example of the lower housing portion according to the present disclosure; and FIG. 14 is a partial, cross-sectional view illustrating the pedestal carousel assembly arranged in a fully lowered position with the pedestal spaced from the platen.

DETAILED DESCRIPTION

Figure 1:
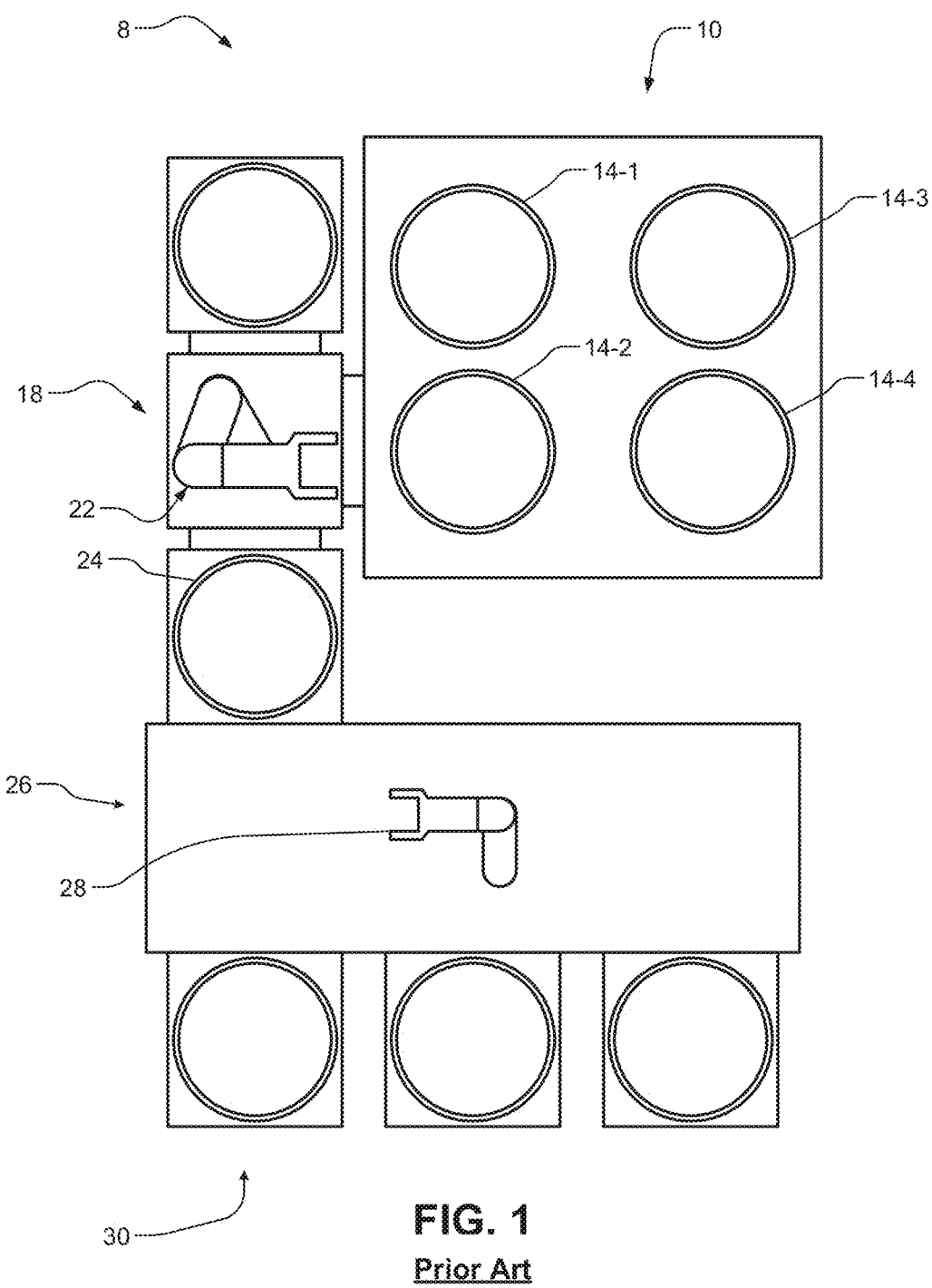
FIG. 1 is a functional block diagram of an example of a semiconductor processing system including a multi-station, sequential processing (MSSP) reactor according to the prior art.
Figure 2:
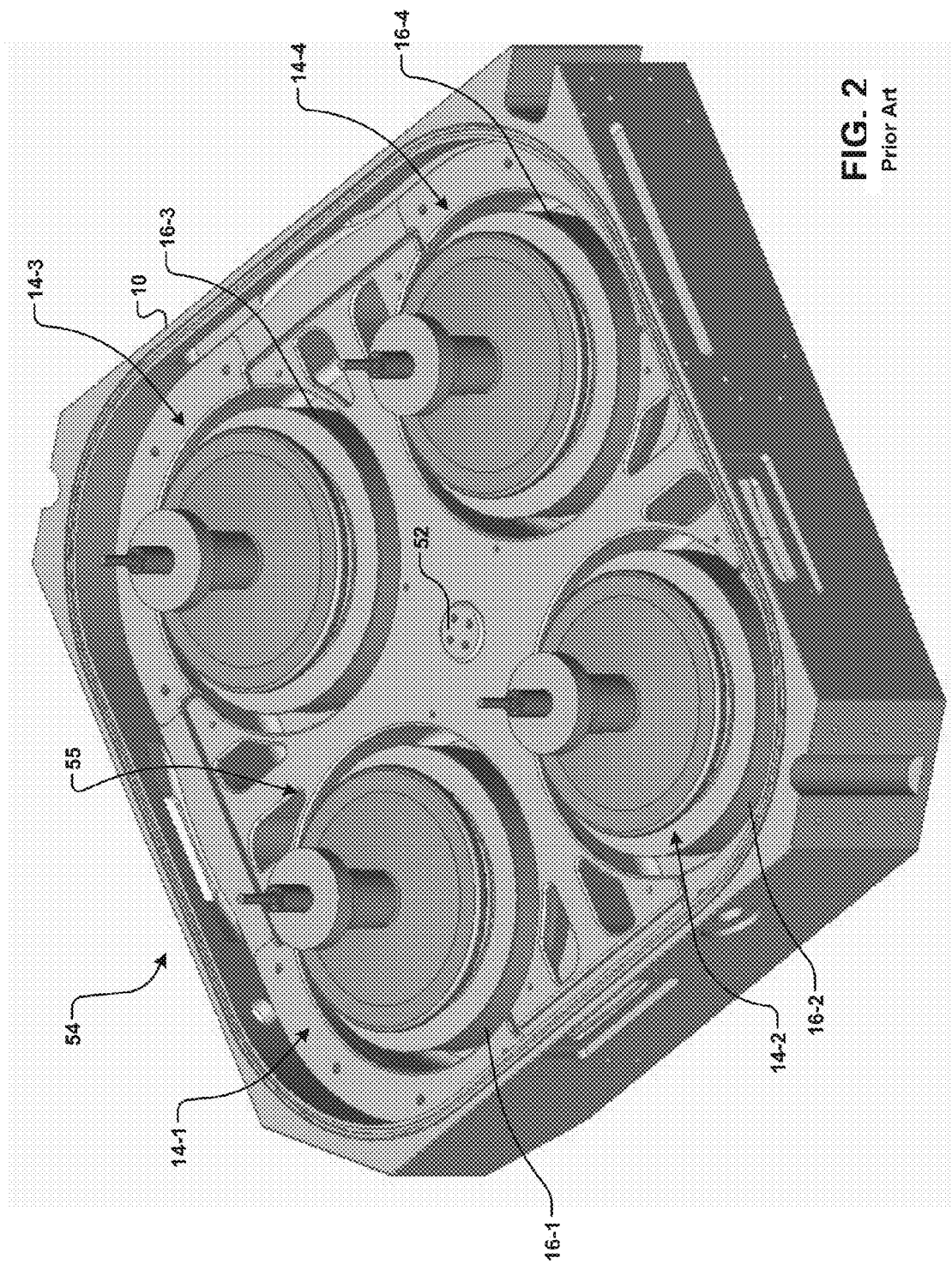
FIG. 2 is a partial perspective view of an example of an indexing mechanism according to the prior art.
Figure 3:
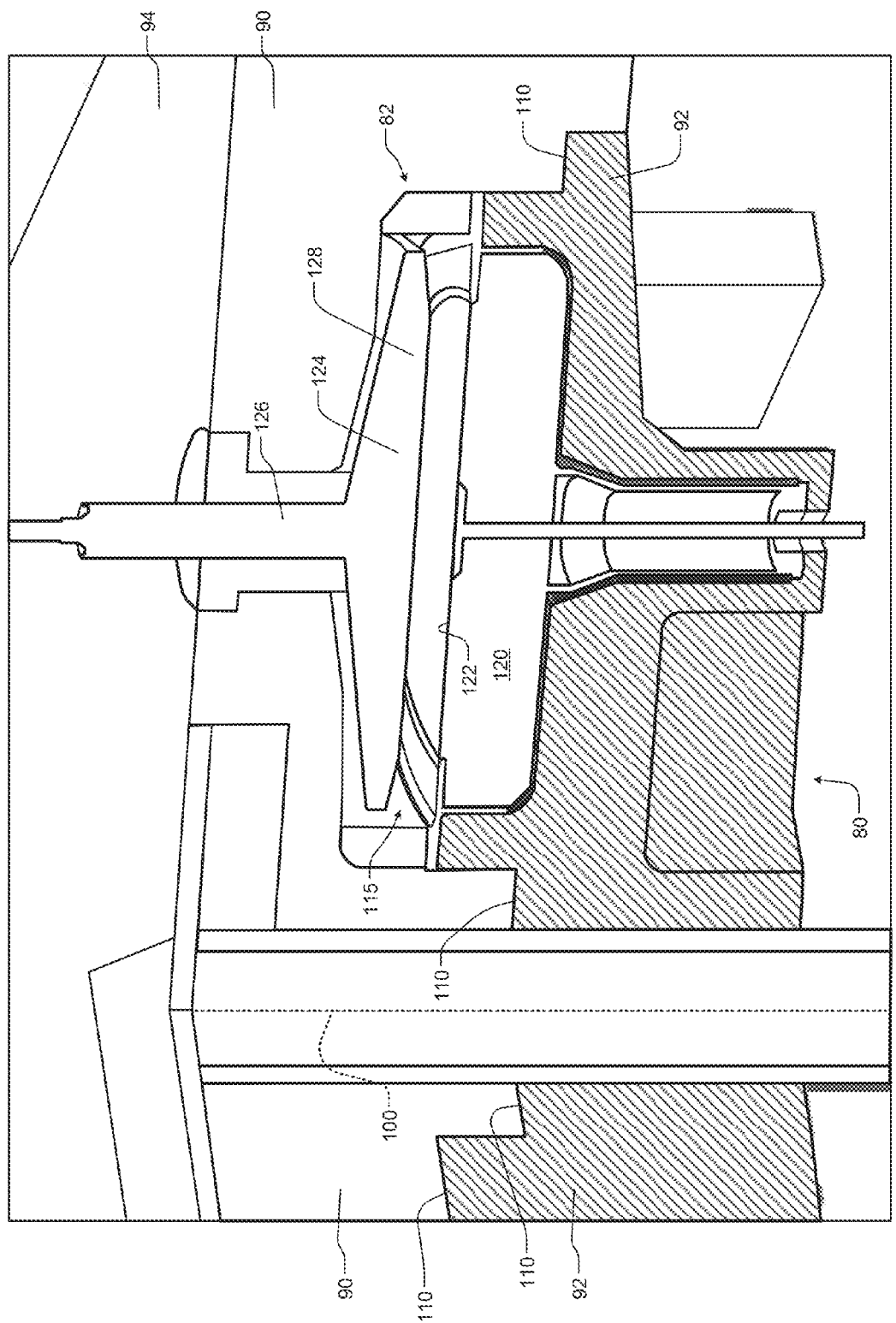
FIG. 3 is a partial perspective view of an example of a semiconductor processing system including a reactor according to the present disclosure.

Referring now to FIG. 3, an example of a reactor 80 according to the present disclosure is shown. The reactor 80 includes an upper housing portion 90 and a lower housing portion 92. The upper housing portion 90 of the reactor 80 is rotationally fixed relative to an axis 100 while the lower housing portion 92 of the reactor 80 including two or more pedestals 120 rotates about the axis 100 relative to the upper housing portion 90. In other words, the lower housing portion 92 operates as a carousel assembly. While one station 82 is shown, the reactor 80 includes one or more additional stations (not shown) that are arranged around the axis 100.

A bearing surface provided at one or more locations 110 may be arranged between the upper housing portion 90 of the reactor 80 and the lower housing portion 92 of the reactor 80 to allow sealing and/or relative rotation. Cavities 115 are defined between the upper housing portion 90 of the reactor 80 and the lower housing portion 92 of the reactor 80 and are associated with the stations 82 of the reactor 80.

A pedestal 120 is attached to the lower housing portion 92 of the reactor 80 and is arranged in a lower housing portion of the cavity 115. A showerhead 124 includes a stem portion 126 and a head portion 128. The stem portion 126 of the showerhead is attached to the upper housing portion 90 of the reactor 80. The head portion 128 is arranged in an upper portion of the cavity 115. Alternative form factors for the showerhead may be used. Moreover, alternative sources may be used such as inductively coupled plasma (ICP) sources, microwave plasma sources, remote plasma, or other plasma sources. Ultraviolet lamp arrays may also be used.

A substrate is transferred onto an upper surface 122 of a pedestal 120 of a first station of the reactor 80 from outside of the reactor 80. The substrate may be transferred from a loadlock or some other transfer location. Then, processing is performed by the stations of the reactor 80. When processing is complete, the carousel assembly including the pedestals and the substrates indexes to the next station (e.g. via rotation of the lower housing portion 92 of the reactor 80 relative to the upper housing portion 90 of the reactor 80).

Since pedestals are part of the carousel assembly and since in this approach, the wafers remain on the pedestals, movement of the carousel assembly (e.g. via rotation of the lower housing portion 92 of the reactor 80 relative to the upper housing portion 90 of the reactor 80) is performed without coordination with an external wafer indexing mechanism or other transfer mechanism, which saves time and increases throughput. For applications such as atomic layer deposition (ALD) where low volume is desired to minimize chemistry consumption, no volume is consumed by the indexer or other wafer transfer mechanism.

In some applications, the bearing surface may include a gas bearing utilizing a pressurized inert gas arrangement both on inside (inner diameter for a circular transport) and outside (outer diameter) with a differential pumping arrangement across the gas bearing. The differential pumping arrangement may include multiple plenums. The plenums include grooves that are connected to different pumps at different levels of vacuum to form a seal.

Figure 4:
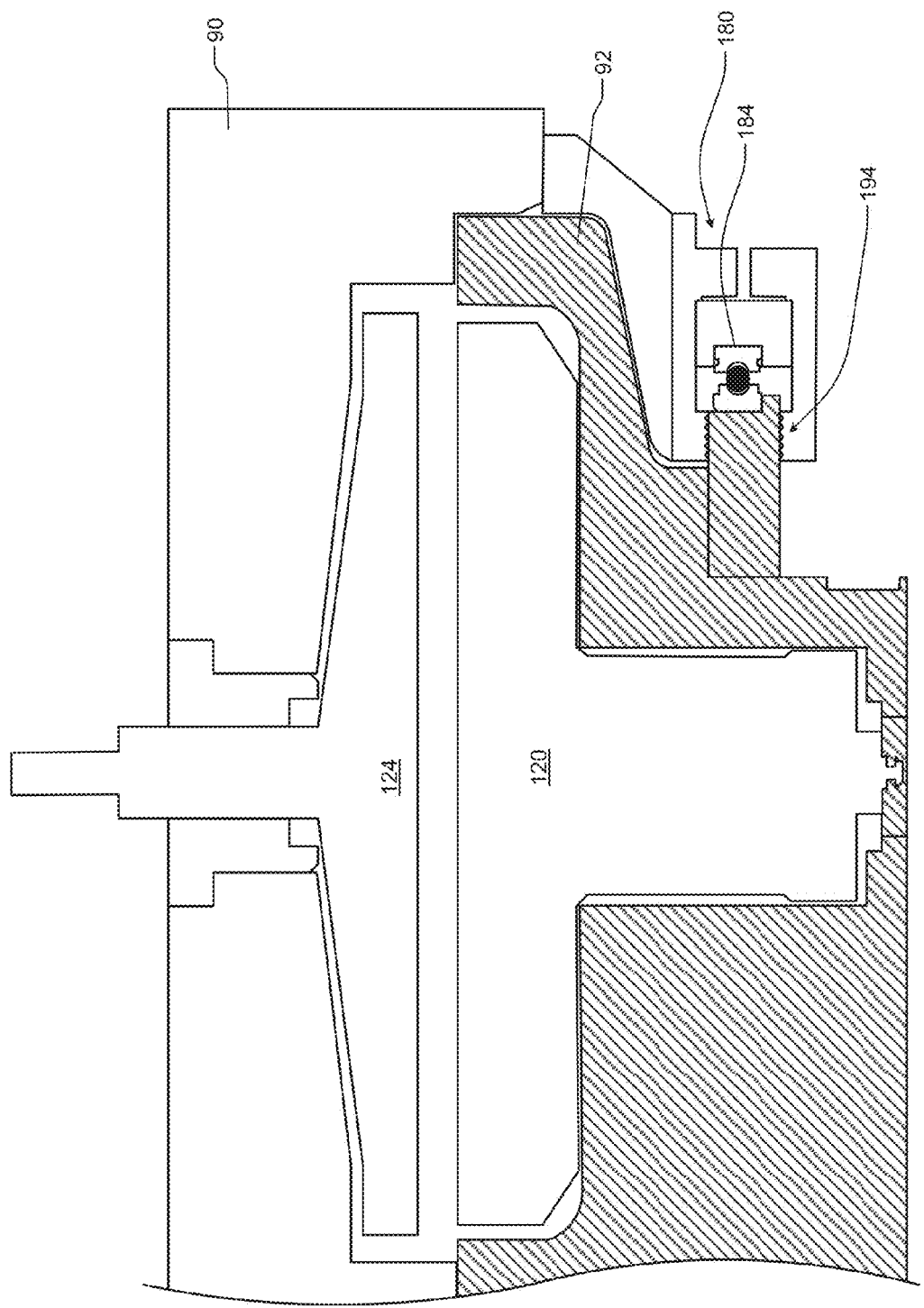
FIG. 4 is a partial perspective view of a ferrofluidic seal for the reactor.

Referring now to FIG. 4, a ferrofluidic seal assembly 180 may be used between the upper housing portion 90 and the lower housing portion 92. For example only, the ferrofluidic seal assembly 180 may include a large diameter, hollow ferrofluidic seal. The ferrofluidic seal assembly 180 includes a mechanical ball bearing assembly 184 including an outer race connected to the upper housing portion 90, an inner race connected to the lower housing portion 92 and multiple balls arranged between the inner and outer races. The ferrofluidic seal assembly 180 includes ferrofluid glands and a dynamic seal identified at 194.

The reactor according to the present disclosure eliminates the need for a mechanical indexing system. Additionally, using a differential pumped, gas bearing arrangement for sealing enables a highly serviceable, low part count design. The approach described above tends to reduce cost while improving throughput. In addition, the lower housing portion 92 of the reactor 80 can be lowered and removed for service, which increases access to the most often adjusted component (the pedestals).

While the substrate processing system has been described in conjunction with ALD, the substrate processing system may be used with other processes such as plasma-enhanced ALD (PEALD), chemical vapor deposition (CVD), plasma-enhanced CVD (PECVD), remote CVD and other types of processes. Similarly designed substrate processing systems are also used to process glass plates for applications such as photovoltaics, flat panel displays, and electrochromic windows.

Figure 5:
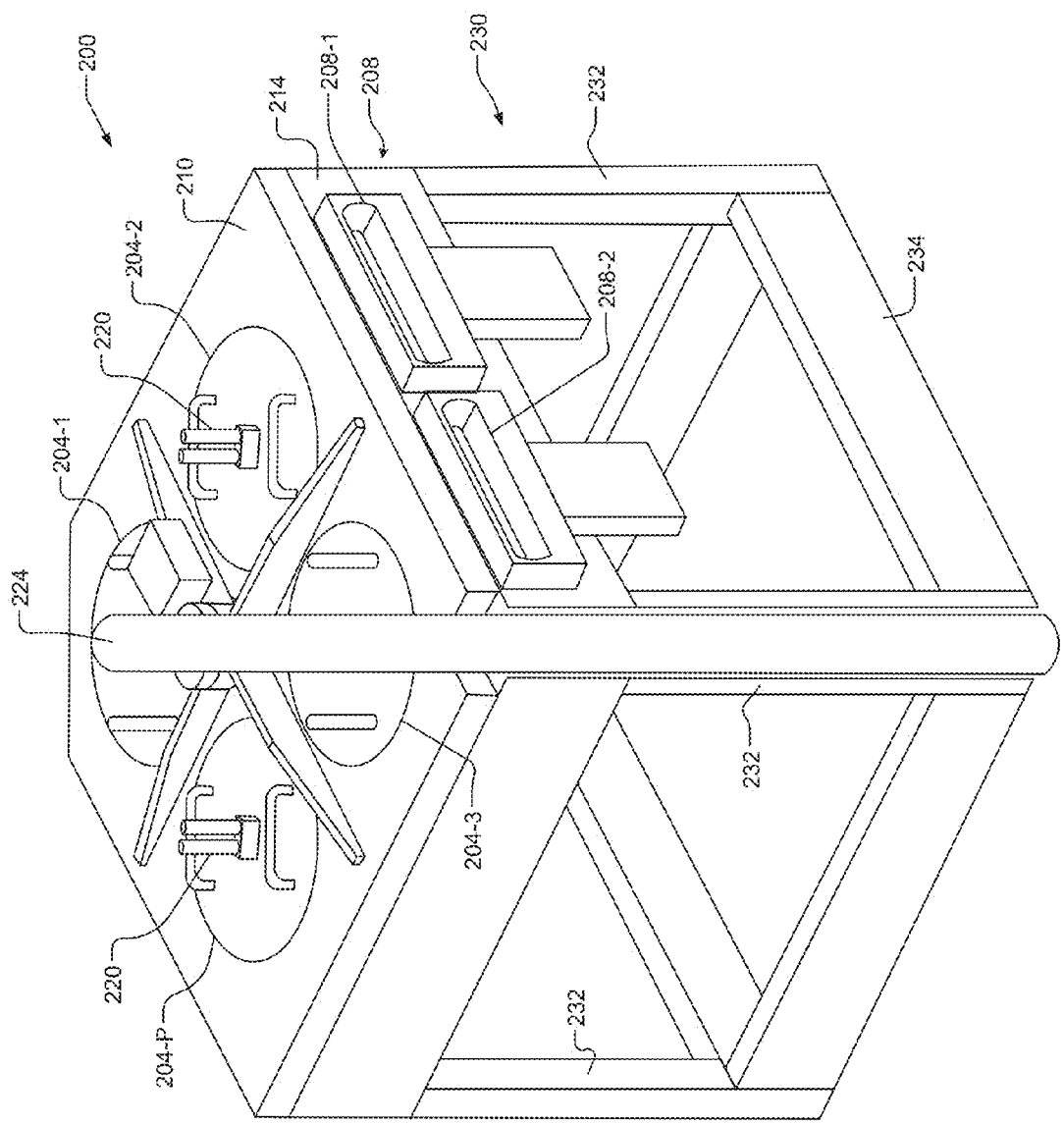
FIG. 5 is a perspective view of an example of a reactor according to the present disclosure.

Referring now to FIG. 5, another example of a reactor 200 according to the present disclosure is shown. The reactor 200 includes a plurality of processing station assemblies 204-1, 204-2, 204-3, . . . , and 204-P collectively processing station assemblies 204), where P is an integer greater than two. One or more substrate loading and unloading apertures 208 (such as apertures 208-1 and 208-2) may be provided to load substrates into the reactor 200 and to unload substrates from the reactor 200.

Figure 6:
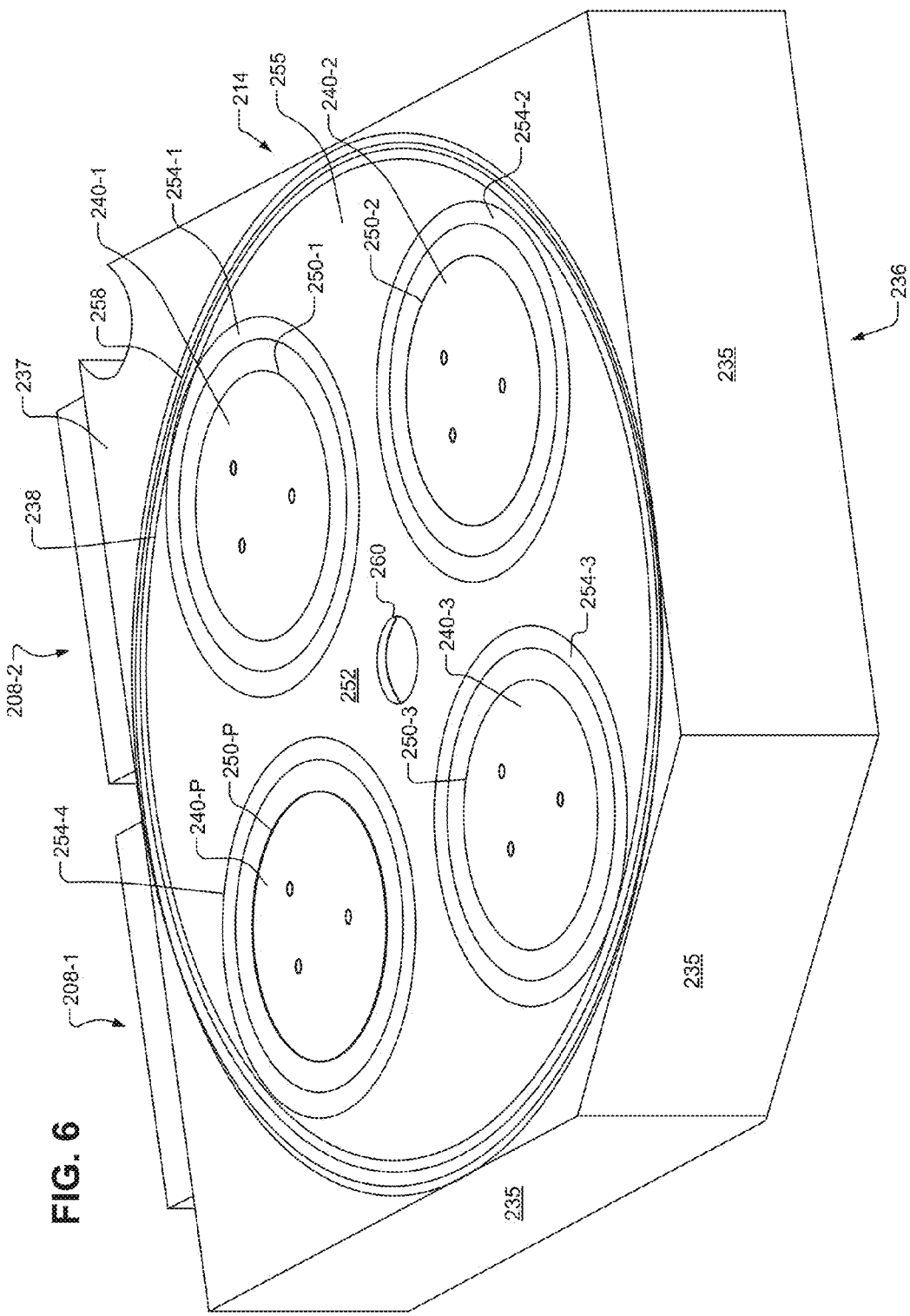
FIG. 6 is a perspective view of an example of a lower housing portion of the reactor of FIG. 5 according to the present disclosure.
Figure 7:
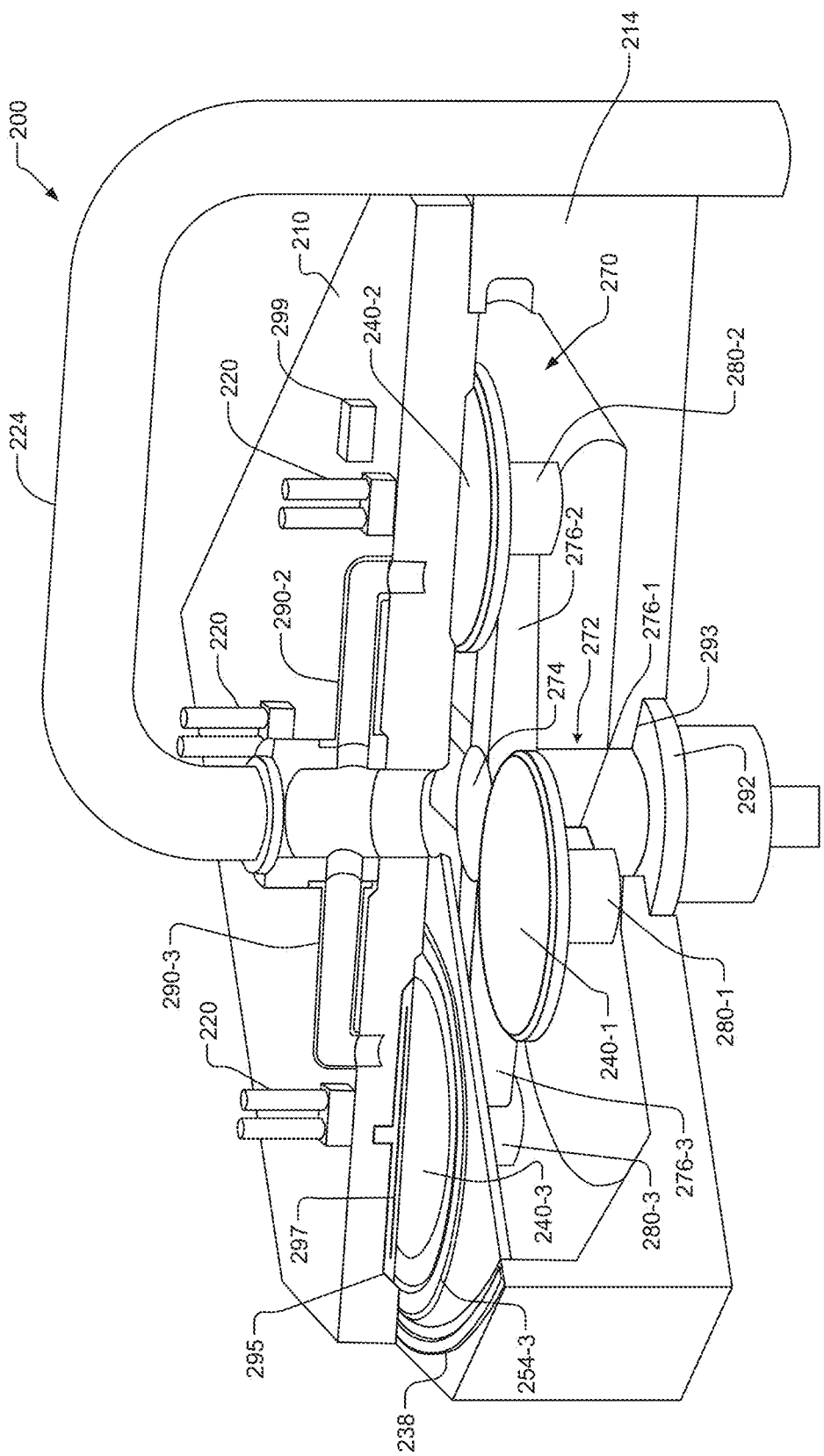
FIG. 7 is a partial perspective, cutaway view of the reactor of FIG. 5 according to the present disclosure.

In this example, the reactor 200 includes an upper housing portion 210 and a lower housing portion 214. Both the upper housing portion 210 and the lower housing portion 214 remain stationary during operation. However, pedestals located within the lower housing portion 214 may be indexed by a pedestal carousel assembly (as shown in FIGS. 6-7) between the processing station assemblies 204. The processing station assemblies 204 may be arranged axisymmetrically around a rotational axis of the pedestal carousel assembly.

Gases such as precursor, purge gas, inert gas, cleaning gas and/or other process gases may be introduced to the processing station assemblies 204 using valves and/or mass flow controllers that are generally identified at 220. An exhaust conduit 224 may be provided to exhaust gases from the processing station using vacuum. In some examples, the exhaust conduit 224 may be connected to the upper housing portion 210 near or adjacent to the rotational axis. In some examples, the reactor 200 may include a supporting frame 230 including two or more legs 232 and base supports 234 connecting adjacent legs 232, although other support structures may be used.

Referring now to FIG. 6, an example of the lower housing portion 214 of the reactor 200 of FIG. 5 according to the present disclosure is shown. The lower housing portion 214 includes sidewalls 235, a bottom surface 236, and a top surface 237 defining an opening 238.

The lower housing portion 214 includes a plurality of pedestals 240-1, 240-2, 240-3, . . . , and 240-P (collectively referred to as pedestals 240). In FIG. 6, the pedestals 240 are arranged in openings 250-1, 250-2, 250-3, . . . , and 250-P (collectively openings 250) in a platen 252. The pedestals may be made of aluminum or aluminum nitride, although other materials may be used. The pedestals may include embedded heaters and/or coolers to provide temperature control of the pedestals.

The platen 252 may be generally circular and planar to provide a surface to mate with a bottom surface of the processing station assemblies. The platen 252 is rotatably received in the opening 238 in the top surface 237. The platen 252 may include annular raised portions 254-1, 254-2, 254-3, . . . , and 254-P (collectively annular raised portions 254) around the openings 250 to provide a fluid restriction when aligned with the corresponding processing station assemblies 204. A pumping plenum 255 is located in areas surrounding the annular raised portions 254. The fluid restriction may comprise a low conductance restriction. In some examples, low conductance refers to at most approximately 7% of the gas flow into the wafer cavity escapes out the restriction. If alternatively a purge gas is employed through the restriction, then the low restriction is best sized such that the purge gas flow does not exceed approximately 7% of the gas flow through the showerhead.

Similarly an annular raised portion 258 may be provided around a periphery of the top surface 237 to provide a restriction or sealing surface between the upper housing portion 210 and the lower housing portion 214. In some examples, the pedestal assemblies remain stationary and indexed during processing and move between index positions after processing in a given location is complete.

An exhaust opening 260 may be provided in the platen 252 aligned with the rotation axis to accommodate connection to the exhaust conduit 224. A valve may be used to control fluid flow in the exhaust. As will be described further below, a pedestal carousel assembly for rotating the pedestals 240 and the platen 252 is located within a cavity defining the lower housing portion 214.

Referring now to FIG. 7, the lower housing portion 214 defines a cavity 270. A pedestal carousel assembly 272 is arranged in the cavity 270. The pedestal carousel assembly 272 includes a central axis 274 (that is coaxially aligned with the rotational axis described above) and arms 276-1, 276-2, . . . , and 276-P (collectively arms 276) that extend radially outwardly from the central axis 274 or hub. The arms 276 connect to pedestal housings 280-1, 280-2, . . . , and 280-P (collectively pedestal housings 280) that are arranged underneath the pedestals 240. In some examples, the arms 276 may be made of stainless steel that has a nickel coating, although other materials may be used. As can be appreciated, a seal may be provided to seal the hub. In some examples, the seal may include a ferrofluidic seal.

In some examples, the exhaust conduit 224 is connected to additional exhaust conduits that 290-1, 290-2, . . . , and 290-P (collectively exhaust conduits 290) that extend radially outwardly from the rotational axis and connect with corresponding ones of the processing station assemblies 204. The controller may control valves to control fluid flow in each of the exhaust conduits 244 and 290. The pedestal carousel assembly 272 may include a flange 292 to provide an upward stop for movement in a z-axis. A seal 293 may be provided to seal a hub of the pedestal carousel assembly and the lower housing portion.

In some examples, at least one of the processing station assemblies 204 includes a showerhead 295. The other processing station assemblies may also include a showerhead or other substrate processing hardware. In some examples, the showerhead 295 may be flush mounted or hanging. Alternately, the showerhead 295 may include a stem that is attached to a wall in a cavity of the corresponding processing station assembly and a base that is attached to the stem and spaced from the wall. Process gas flows through the stem and into the base. Gas flows out of the base through gas dispersion holes and into the reaction volume. The showerhead 295 may be made of a dielectric material with an embedded electrode 297 or made of a conducting material such as metal. The showerhead 295 (or the RF electrode 297) may be connected to a plasma generator to generate plasma inside the corresponding reaction volume. Alternately, the pedestal may be connected to a plasma generator to generate plasma.

In some examples, the showerhead 295 may be made of a dielectric material such as ceramic. In other examples, the showerhead 295 may be made in accordance with U.S. patent application Ser. No. 13/858,477, filed on Apr. 8, 2013, and entitled "Ceramic Showerhead with Embedded RF Electrode for Capacitively Coupled Plasma reactor", which is hereby incorporated by reference in its entirety. In other examples, a remote plasma source 299 may be used. While a showerhead is shown, the processing station assemblies may perform CVD, PECVD, physical vapor deposition (PVD), processing using a remote plasma source, ultraviolet (UV) processing, or other substrate processing.

Figure 8:
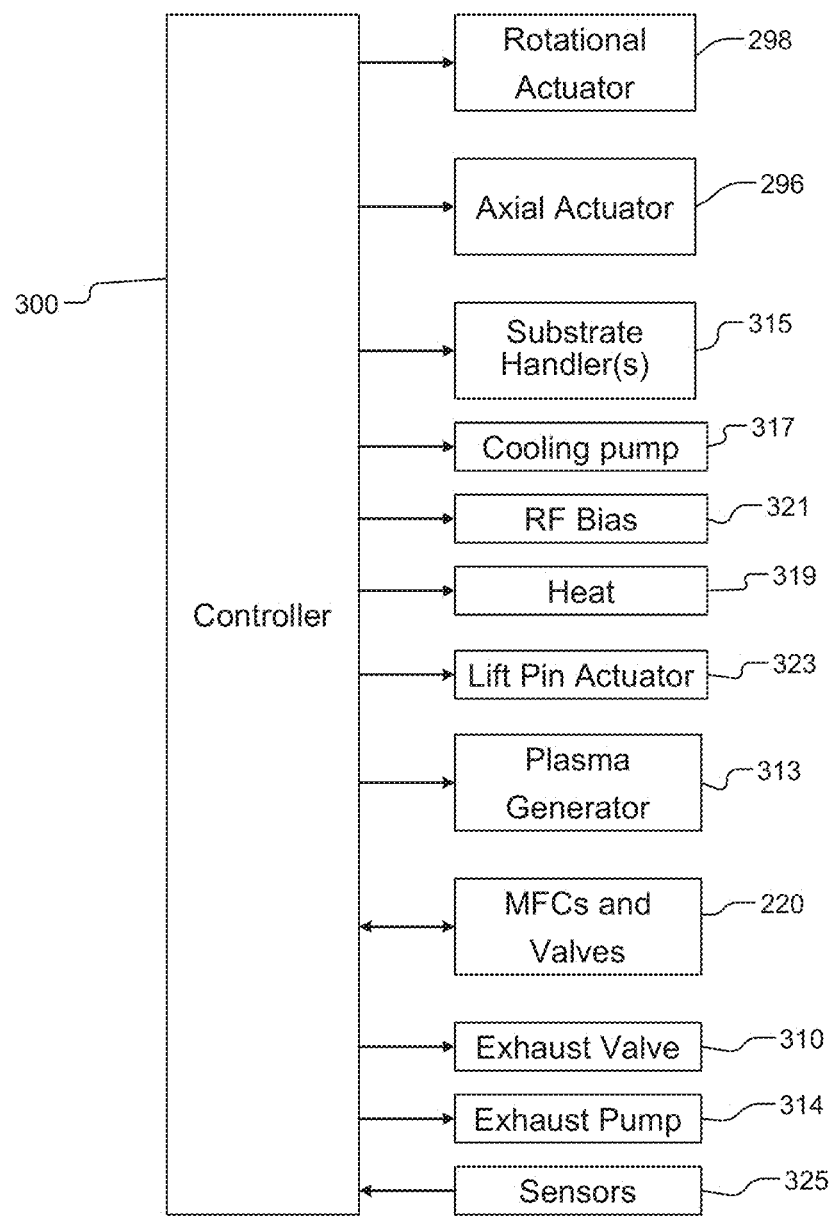
FIG. 8 is a functional block diagram of an example of a controller configured to operate the reactor.

Referring now to FIG. 8, z-axis movement of the pedestal carousel assembly 272 may be performed by axial actuator 296. A rotational actuator 298 may be provided to rotate the pedestal carousel assembly 272. A controller 300 may be provided to control the rotational actuator 298 and the axial actuator 296. The controller 300 may also be used to control one or more exhaust valves, exhaust valves 310 and pumps 314 associated with purging exhaust gas. Likewise, the controller 300 may be used to control valves and/or mass flow controllers (generally identified at 220) to selectively provide gases to the processing station assemblies 204.

The controller 300 may also communicate with a plasma generator 313 to control signals to generate plasma. The controller 300 may control or communicate with a substrate handler 315 to load and unload substrates via the apertures 208. The controller 300 may communicate with a coolant pump 317 to control flow of coolant. The controller 300 may communicate with a heater control 319 to control a temperature of the pedestals. The controller 300 may communicate with a lift pin actuator 323 to control a position of lift pins. The controller 300 may also communicate with sensors 325 such as temperature and pressure sensors to monitor operating conditions that are associated with one or more of the processing station assemblies and/or pedestals.

Figure 9:
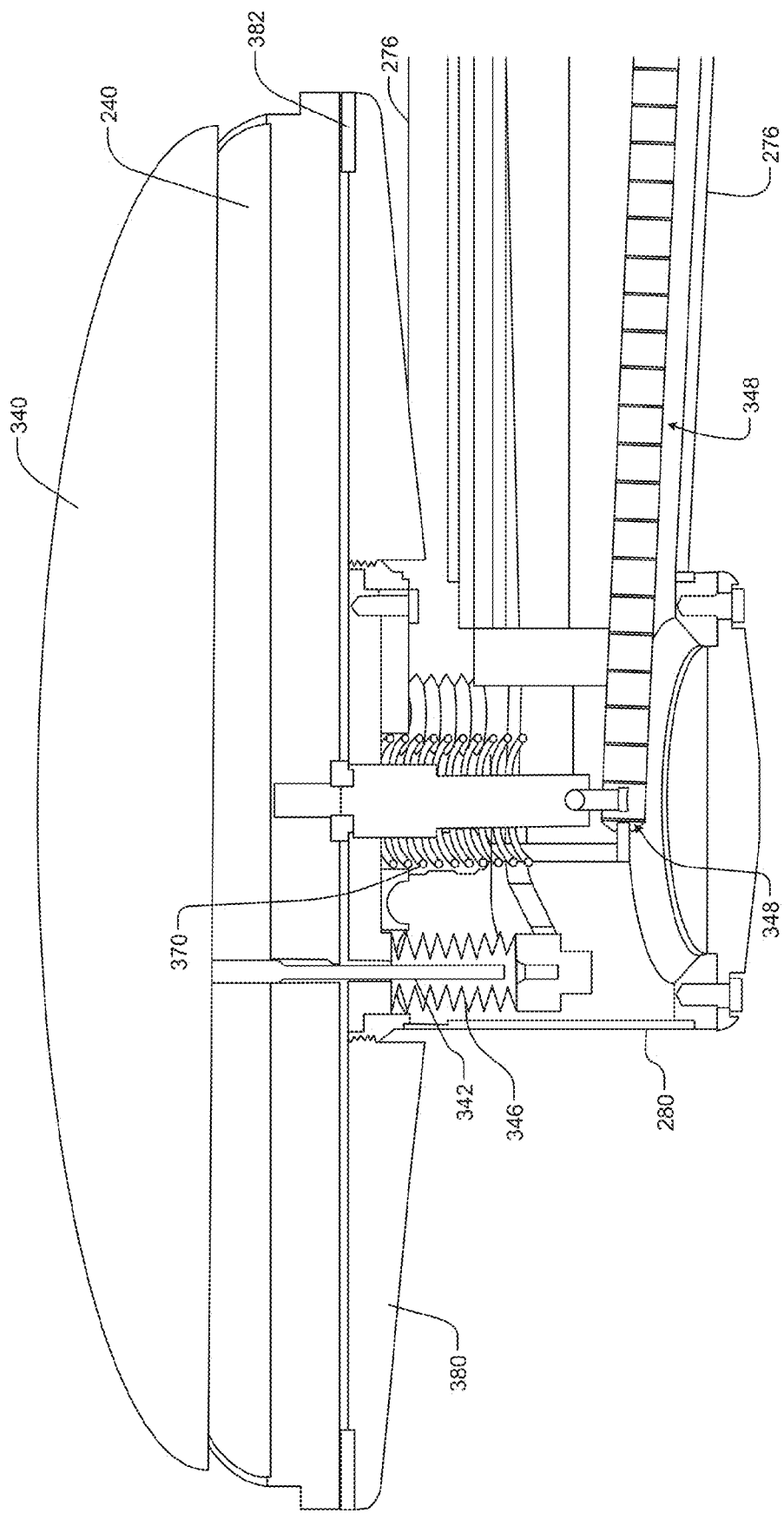
FIG. 9 is a cross-sectional view of an example of a pedestal according to the present disclosure.

Referring now to FIG. 9, an example of the pedestal 240 and the pedestal housing 280 is shown. A substrate 340 may be positioned on the pedestal 240. One or more lift pins 342 may be used to raise and lower the substrate onto and off of the pedestal 240. Bellows 346 may be used to provide a seal for the moveable lift pins 342. A lift crank mechanism 348 may be used to adjust a position of the lift pins 342, although other mechanisms may be used.

Electrical connections may be provided via a housing of the arm 276 to supply RF pedestal bias or heat control signals to the pedestal 240. Cooling fluid may also be provided by conduits to a coolant coil 370 via the housing of the arm 276. The cooling loop may be provided to cool the arm housing to prevent expansion due to elevated temperatures. In some examples, the coolant coil 370 may be made of stainless steel, although other materials may be used.

An isolation plate 380 may be provided to improve isolation below the pedestal 240. In some examples, the isolation plate 380 includes a central opening, is annular and has a radially inner thickness that is greater than a radially outer thickness. In some examples, the isolation plate 380 is made of a dielectric material such as ceramic. In some examples, the isolation plate 380 is spaced from the pedestal 240 by a gap that is greater than zero. Spacers 382 such as annular spacers may be provided. In some examples, the gap is greater than zero and less than twice the plasma sheath distance, although other gap dimensions may be used.

As can be appreciated, slip rings and connectors may be used to supply the RF bias, heater power, and coolant to the pedestals 240.

Figure 11:
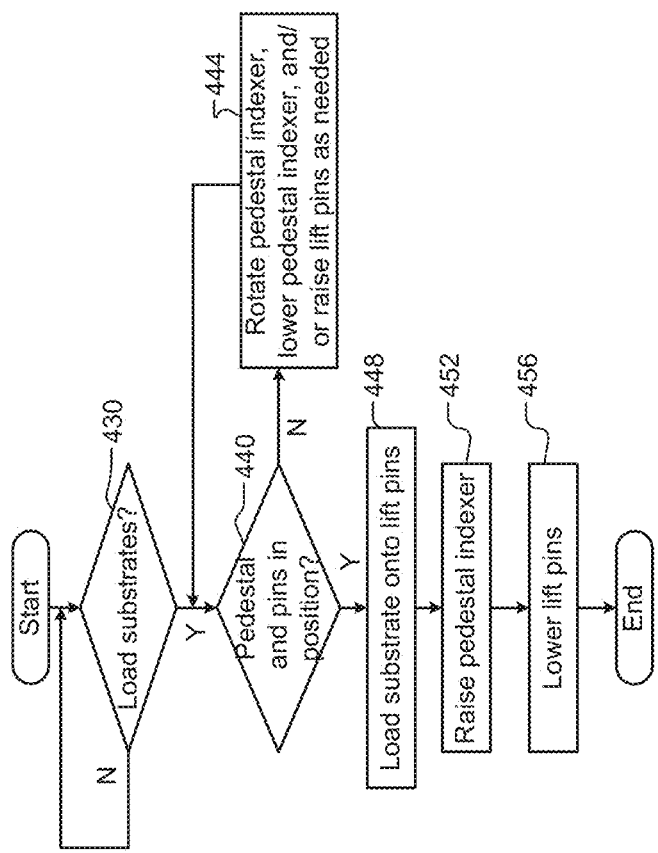
FIGS. 10 and 11 illustrate examples of methods for unloading and loading substrates according to the present disclosure.
Figure 10:
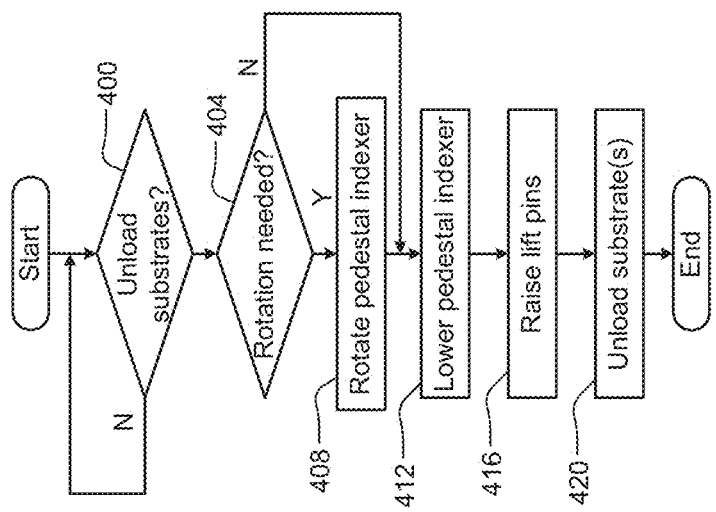

Referring now to FIGS. 10 and 11, examples of methods for unloading and loading substrates are shown. In FIG. 10, control determines whether substrates need to be unloaded at 400. At 404, control determines whether the pedestal carousel assembly needs to be rotated to perform unloading. If 404 is true, control rotates the pedestal carousel assembly 272 at 408. Control continues from 404 (if false) and 408 with 412 where control lowers the pedestal carousel assembly 272 in the direction away from the upper housing portion. At 416, control raises the lift pins to raise the substrate off of the pedestal 240. At 420, control unloads the substrates using the substrate handler 315. As can be appreciated, two or more of the rotation of the pedestal carousel assembly 272, lowering of the pedestal carousel assembly 272 and raising of the lift pins in operations 408, 412 and 416 can be performed at the same time to reduce cycle times. As can be appreciated, since two openings 208-1 and 208-2 are provided, the pedestal carousel assembly 272 can be arranged to allow to two substrates to be loaded or unloaded at the same time.

In FIG. 11, control determines whether substrates need to be loaded at 430. In 440, control determines whether the pedestals 240 and the lift pins are in a desired position for loading. If 440 is false, control rotates the pedestal carousel assembly 272, lowers the pedestal carousel assembly 272 and/or raises lift pins as needed to obtain the desired position for loading at 444. As can be appreciated, two or more of the rotation of the pedestal carousel assembly 272, lowering of the pedestal carousel assembly 272 and raising of the lift pins in 444 can be performed at the same time to reduce cycle times.

If 440 is true, control loads a substrate onto the lift pins at 448. Control raises the pedestal carousel assembly 272 at 452. Control lowers lift pins at 456 such that the substrate is moved closer to or onto the pedestal 240. As can be appreciated, the raising of the pedestal carousel assembly 272 and lowering of the lift pins in 452 and 456 can be performed at the same time to reduce cycle times.

Figure 12:
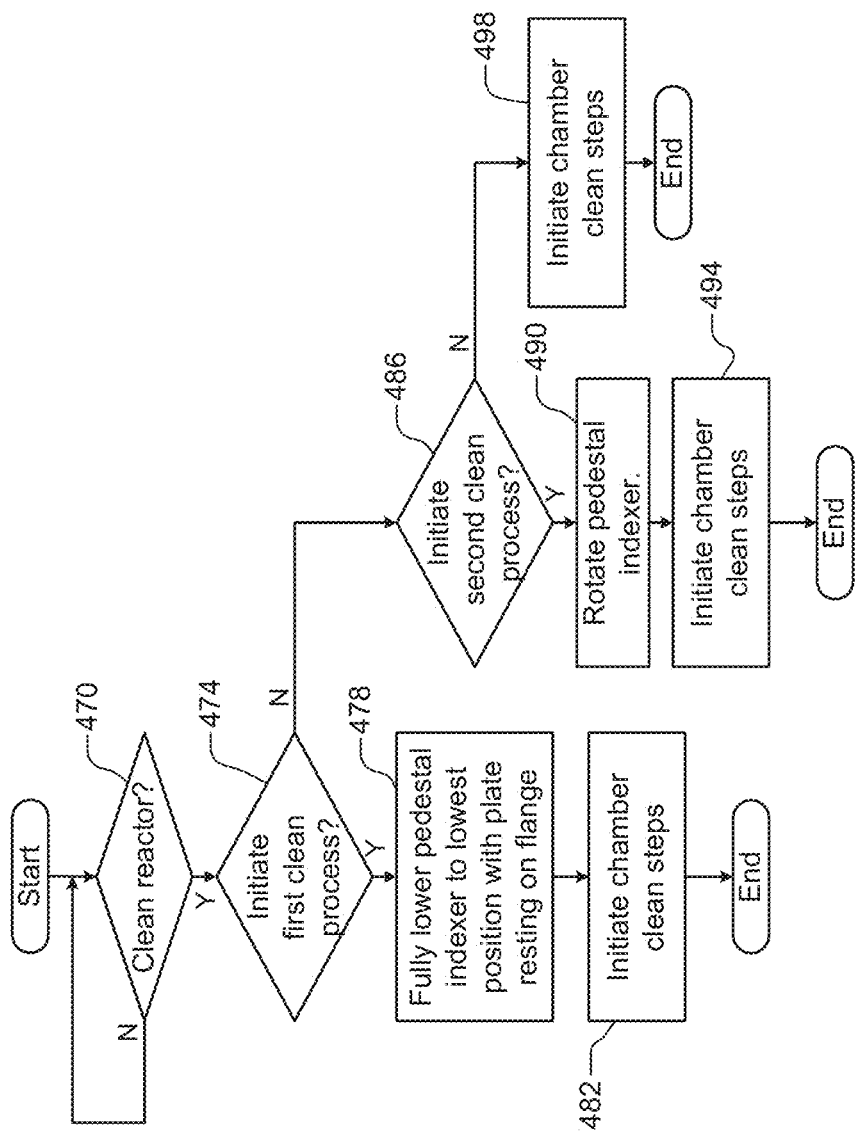
FIG. 12 illustrates an example of methods for cleaning the reactor according to the present disclosure.

Referring now to FIG. 12, examples of methods for cleaning the reactor according to the present disclosure are shown. At 470, control determines whether the reactor 200 needs to be cleaned. If 470 is true, control determines whether a first clean process is selected. The first clean process may correspond to a deep clean cycle for the reactor 200. In this example, control fully lowers the pedestal carousel assembly 272 to a lowest position. As the pedestal carousel assembly 272 is lowered, a flange biases and holds the platen 252 and the pedestals 240 and arms 276 continue to move downwardly to a stop position. The pedestals 240 and the platen 252 are now located in different planes (the pedestals 240 are located below the platen 252). At 482, control initiates chamber cleaning steps associated with the first clean cycle. The first clean cycle allows cleaning of additional portions of the reactor including the processing station assemblies 204, the platen 252 and structures located below the platen 252.

If 474 is false, control may initiate a second clean process corresponding to an intermediate clean cycle. If 486 is true, control rotates the pedestal carousel assembly 272 to a position between fully indexed positions (approximately halfway between). At 494, control initiates chamber cleaning steps associated with the second clean cycle. By moving the pedestal carousel assembly 272 to a position between fully indexed positions, a seal between the processing station 204 and the partially overlapping pedestal 240 is not created. Therefore, cleaning gas will flow not only to the processing station assemblies 204 but also to areas surrounding the annular raised portions located around the pedestals 240.

If 486 is false, control may initiate a third or lighter clean cycle at 498 by initiating chamber cleaning steps associated with the third clean cycle. The third clean cycle allows cleaning of the reaction volumes associated with the processing station assemblies.

In some examples, the pedestal assemblies are rotated during at least part of a cleaning process. Alternately, the pedestal assemblies may be rotated continuously during the cleaning process.

As can be appreciated, fluidic or azimuthal gate valves can be used to isolate the pumping plenum from the substrate cavity. The reactor 200 according to the present disclosure provides a fully axisymmetric, flush mount showerhead reactor design with integrated lift pins for substrate transfer.

As can be appreciated, the reactors according to the present disclosure significantly reduce substrate contact events by performing multiple steps in the reactor. Furthermore, independent movement in the z-axis, rotation and lift pin position movements can be performed, which reduces cycle times. For example, two or more types of movement can be performed at the same time.

Additionally, the reactor significantly reduces reaction volumes. For example only, a 0.25 L showerhead and a 1.0 L substrate cavity can be used. In other examples, the showerhead is less than 0.5 L and the substrate cavity is less than 2.0 L, although higher or lower volumes may be used. With the smaller showerhead and substrate cavity volumes, the reactor provides significantly lower cost of operation as compared to conventional reactors. The reactor according to the present disclosure can be used for atomic layer deposition (ALD) or plasma-enhanced ALD (PEALD) using expensive precursors while maintaining a relatively lower cost of operation.

In some implementations, ceramic components are used in the substrate cavity to enable use of a wide range of process chemistries. Furthermore, by providing variable cleaning cycles, the pedestal carousel assembly can be lowered to run clean cycles that aren't impeded by small reactor volume features as is the case with other designs. Once the substrates are loaded, the pedestals may be cycled or indexed very quickly. For example, the pedestals can be moved between fully indexed positions with cycle times lower than 2 seconds with no z-axis motion. As can be appreciated, in some conventional systems, movement between indexed positions requires z-axis movement that requires at least 7-10 seconds at a minimum to accomplish, which increases cycle times.

Referring now to FIGS. 13 and 14, an example of the lower housing portion according to the present disclosure is shown. In FIG. 14, an inner surface of the cavity 270 may include one or more projecting surfaces such as a ledge 520 and/or posts 524 that are configured to lift the platen 252 as the pedestal carousel assembly is lowered such that the pedestal 240 and pedestal carousel assembly can continue to move lower while the platen 252 is stopped to define a gap between the pedestal 240 and the platen 252. In FIG. 14, the pedestal carousel assembly is in a lowered position with the pedestal 240 spaced from the platen 252 to define a gap 540. When cleaning, the gap allows cleaning gas to enter into additional areas below the pedestal 240 and the platen 252 to provide additional cleaning.

In some one example, multiple wafers are moved into simultaneous processing zones. The zones are preferentially separated by a low conductance restriction feature. This restriction feature is typically pumped, although purging can be used. The pumping or purging may be continuous or intermittent. In some examples, the reactor includes four heated pedestals arranged in a single, rotatable assembly. The pedestals in the assembly are loaded with substrates in a first position, then the assembly is raised to a second, higher processing position.

Substrates may be indexed to a subsequent processing station by a pure rotation with no axial motion. When processing terminates, the substrates are lowered back to a first position, the substrates are raised on the lift pins, and the substrates are unloaded. The substrate lift may be simultaneous with the movement of the assembly back to the first position. Typically, one or two wafers are unloaded at a time after which the assembly indexes (e.g. by 90 or 180 degrees when four pedestal assemblies are used) to deliver one or two wafers to the external wafer handling system. While this transfer-related index occurs, the lift pins may simultaneously raise the substrate.

Cleaning of the reactor with reactive gases preferentially occurs with the assembly in a position lower than the second position. Moreover, the effectiveness of the cleans can be increased by lowering the assembly to a third position, which is lower than the first position, at which point the assembly platen disk feature can disengage from the rest of the assembly, exposing a gap between the platen and the pedestals. After cleaning, the assembly can raise and engage the platen disk again. The pedestal carousel assembly may be advanced by a partial index (e.g. 45 degrees when four pedestal assemblies are used) placing the pedestals between the processing station assemblies. In another embodiment, the assembly may continuously rotate during the cleaning operation. After cleaning, the assembly can raise and engage the platen disk again.

In some examples, the reactor provides multiple well defined, axisymmetric process cavities during wafer processing, and provides a single large, interconnected, high conductance cavity during cleaning. Specifically for ALD processing applications, the reactor design provides multiple well-defined, ultra-low volume, axisymmetric process cavities during wafer processing, and provides a single large, interconnected, high conductance, large volume cavity during cleaning. Thus, the reactor transforms to be optimally configured for processing sometimes and optimally configured for cleaning at other times. The desired features of a reactor optimized for processing are typically in conflict in many ways with the features desired for cleaning.

In other examples, the pedestal carousel assembly has a process position where the P pedestal assemblies and the P processing stations define P axially-symmetric reactor volumes without viewport apertures or gauge ports to improve process uniformity.

In other examples, each of the P axially-symmetric reaction volumes are defined in part by a low conductance restriction having a diameter in a plane parallel to the platen that is less than 5%, 10%, 15%, 20% or 30% larger than the P openings. The pedestal carousel assembly has a cleaning position where the low conductance restrictions are removed and reactive gases flow via paths having a higher conductance than the low conductance restriction around the P processing station assemblies, the P pedestal assemblies and a surface of the platen facing the P processing station assemblies.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A reactor for processing a plurality of substrates, comprising:
    a chamber housing comprising an upper chamber housing and a lower chamber housing;
        wherein the lower chamber housing has a pedestal carousel assembly disposed therein, and wherein the lower chamber housing is configured to rotate about a vertical axis relative to the upper chamber housing;
        wherein the upper chamber housing is arranged adjacent to the lower chamber housing and is rotationally fixed;
    P processing station assemblies arranged symmetrically around the axis, where P is an integer greater than one, wherein the P processing station assemblies are arranged within respective cavities defined between the upper chamber housing and the lower chamber housing;
    P pedestal assemblies arranged in the pedestal carousel assembly of the lower chamber housing symmetrically around the axis, each of the P pedestal assemblies including a pedestal, wherein the P pedestal assemblies are arranged in respective portions of the cavities in the lower housing chamber; and
    a rotational actuator to rotate the lower chamber housing including the pedestal carousel assembly relative to the axis to selectively index the P pedestal assemblies with the P processing station assemblies,
    wherein each of the P processing station assemblies processes substrates arranged on corresponding ones of the P pedestal assemblies at the same time.

2. The reactor of claim 1, further comprising a platen including P openings, wherein the P pedestal assemblies are located in the P openings of the platen.

3. The reactor of claim 2, wherein the platen includes P annular raised portions located around the P openings, and wherein the P annular raised portions circumscribe the P processing station assemblies when aligned to provide a fluid restriction between volume inside and outside of the P processing station assemblies and the P pedestal assemblies.

4. The reactor of claim 3, further comprising a pump to selectively pump fluid outside of the restriction created by the P annular raised portions during processing.

5. The reactor of claim 4, further comprising a controller to control the pump, to supply process gases to the P processing station assemblies during processing and to evacuate process gases in the P processing station assemblies before the pedestal carousel assembly indexes the P pedestal assemblies to a next index position.

6. The reactor of claim 2, further comprising a controller configured to position the pedestal carousel assembly in a cleaning position, wherein the pedestal carousel assembly is not aligned with the P processing station assemblies to clean areas between the P processing station assemblies and the P pedestal assemblies and portions of the platen located between the P pedestal assemblies.

7. The reactor of claim 2, further comprising a controller configured to position the pedestal carousel assembly in a cleaning position, wherein the pedestal carousel assembly is lowered and the platen is raised relative to the P pedestal assemblies to define a gap between the platen and the P pedestal assemblies to allow cleaning of the P processing station assemblies, the P pedestal assemblies, and surfaces in a cavity below the platen.

8. The reactor of claim 7, wherein the lower chamber housing includes at least one of a ledge and a post to lift the platen as the pedestal carousel assembly is lowered to define the gap.

9. The reactor of claim 2, wherein:
the pedestal carousel assembly has a process position where the P pedestal assemblies and the P processing stations define P axially-symmetric chamber housing volumes, without viewport apertures or gauge ports, to improve process uniformity.

10. The reactor of claim 9, wherein:
each of the P axially-symmetric chamber housing volumes are defined in part by a low conductance restriction having a diameter in a plane parallel to the platen that is less than 15% larger than the P openings, and
the pedestal carousel assembly has a cleaning position where the low conductance restrictions are removed and reactive gases flow via paths having a higher conductance than the low conductance restriction around the P processing station assemblies, the P pedestal assemblies and a surface of the platen facing the P processing station assemblies.

11. The reactor of claim 1, wherein indexing of the P pedestal assemblies between the P processing station assemblies during processing is performed by rotating the P pedestal assemblies in a single plane and without a change in an axial location of the P pedestal assemblies.

12. The reactor of claim 1, further comprising:
an aperture through a wall of the chamber housing to allow loading and unloading of the substrates;
an axial actuator to adjust an axial position of the pedestal carousel assembly; and
a controller configured to communicate with the axial actuator and the rotational actuator, to lower the pedestal carousel assembly in an axial direction and to align one of the P pedestal assemblies with the aperture during loading and to raise the pedestal carousel assembly in an opposite axial direction for processing.

13. The reactor of claim 12, wherein at least one of the P pedestal assemblies further comprises lift pins that move with the P pedestal assemblies and that raise and lower a substrate relative to a pedestal of one of the P pedestal assemblies.

14. The reactor of claim 1, further comprising:
a lift pin actuator;
a substrate handler; and
a controller in communication with the lift pin actuator and the substrate handler and configured to:
lower the pedestal carousel assembly;
position the lift pins of at least one pedestal in a raised position; and
position a substrate on the at least one pedestal.

15. The reactor of claim 14, wherein the controller is further configured to:
raise the pedestal carousel assembly;
position the lift pins of the at least one pedestal in a lowered position;
process the substrate in one of the P processing station assemblies; and
index the substrate to other ones of the P processing station assemblies and process the substrate in the other ones of the P processing station assemblies.

16. The reactor of claim 15, wherein, when unloading, the controller lowers the pedestal carousel assembly at the same time as the controller raises the lift pins of the at least one pedestal and wherein, when loading, the controller raises the pedestal carousel assembly at the same time as the controller lowers the lift pins of the at least one pedestal.

17. The reactor of claim 1, wherein at least one of the P processing station assemblies includes a showerhead.

18. The reactor of claim 17, wherein the showerhead is made of a dielectric material and includes an embedded electrode.

19. The reactor of claim 1, wherein the reactor performs atomic layer deposition (ALD) in at least one of the P processing station assemblies.

20. The reactor of claim 1, wherein the reactor performs plasma-enhanced atomic layer deposition (PEALD) in at least one of the P processing station assemblies.

21. The reactor of claim 1, further comprising a controller configured to position the pedestal carousel assembly in a cleaning position, wherein the pedestal carousel assembly aligns the P pedestal assemblies with the P processing station assemblies to clean areas inside the P pedestal assemblies and the P processing station assemblies.

22. The reactor of claim 1, wherein:
the upper chamber housing includes P openings, and wherein the P processing station assemblies are located in the P openings.

23. The reactor of claim 22, further comprising:
an exhaust opening formed in the upper chamber housing and aligned with the axis; and
an exhaust conduit connected to the exhaust opening.

24. The reactor of claim 23, further comprising P radial exhaust conduits extending radially outwardly from the exhaust conduit and fluidly connected to the P processing station assemblies.

25. The reactor of claim 22, further comprising a bearing surface located between the upper chamber housing and the lower chamber housing to provide sealing between the upper chamber housing and the lower chamber housing and to allow rotation of the lower chamber housing relative to the upper chamber housing.

26. The reactor of claim 25, wherein the bearing surface includes a gas bearing.

27. The reactor of claim 26, wherein the gas bearing is differentially pumped.

28. The reactor of claim 22, further comprising a ferrofluidic seal assembly arranged between the upper chamber housing and the lower chamber housing.

29. The reactor of claim 22, further comprising a seal arranged between the lower chamber housing and a lower portion of a hub of the pedestal carousel assembly.

30. The reactor of claim 1, further comprising:
first and second apertures through at least one wall of the chamber housing; and
a controller configured to lower the pedestal carousel assembly to allow unloading of first and second substrates from first and second pedestals of first and second ones of the P pedestal assemblies and loading of third and fourth substrates onto the first and second pedestals of the first and second ones of the P pedestal assemblies.

31. The reactor of claim 30, wherein the controller is configured to rotate the pedestal carousel assembly to allow unloading of fifth and sixth substrates from third and fourth pedestals of third and fourth ones of the P pedestal assemblies and loading of seventh and eighth substrates onto the third and fourth pedestals of the third and fourth ones of the P pedestal assemblies.

32. The reactor of claim 30, wherein the controller is configured to raise the pedestal carousel assembly and index the P pedestal assemblies with the P processing station assemblies.

33. The reactor of claim 1, wherein the pedestal carousel assembly is rotated during cleaning.

34. The reactor of claim 1, wherein the pedestal carousel assembly is moved midway between index positions during cleaning.

35. The reactor of claim 1, wherein a pedestal of at least one of the P pedestals assemblies includes an isolation plate arranged below and spaced from the pedestal to define a gap that is less than twice a plasma sheath distance.

36. The reactor of claim 1, wherein a pedestal of at least one of the P pedestal assemblies includes at least one of a heater or a cooler.

37. The reactor of claim 1, wherein the reactor performs chemical vapor deposition (CVD) in at least one of the P processing station assemblies.

38. The reactor of claim 37, wherein the reactor performs plasma-enhanced CVD (PECVD) in at least one of the P processing station assemblies.

39. The reactor of claim 1, further comprising a remote plasma source to supply plasma to at least one of the P processing station assemblies.

40. The reactor of claim 1, wherein the reactor performs ultraviolet (UV) processing in at least one of the P processing station assemblies.

41. The reactor of claim 1, wherein the reactor performs physical vapor deposition (PVD) in at least one of the P processing station assemblies.

* * * * *